(12) United States Patent
Ayya et al.

(10) Patent No.: US 12,026,009 B2
(45) Date of Patent: Jul. 2, 2024

(54) QUADRATURE CLOCK GENERATOR WITH DUTY CYCLE CORRECTOR

(71) Applicant: Synaptics Incorporated, San Jose, CA (US)

(72) Inventors: Chandra Shekar Reddy Ayya, Hyderabad (IN); Jae Won Choi, Irvine, CA (US)

(73) Assignee: Synaptics Incorporated, San Jose, CA (US)

( * ) Notice: Subject to any disclaimer, the term of this patent is extended or adjusted under 35 U.S.C. 154(b) by 36 days.

(21) Appl. No.: 18/061,936

(22) Filed: Dec. 5, 2022

(65) Prior Publication Data

US 2023/0244266 A1 Aug. 3, 2023

Related U.S. Application Data

(60) Provisional application No. 63/306,408, filed on Feb. 3, 2022.

(51) Int. Cl.
*G06F 1/08* (2006.01)
*G06F 1/14* (2006.01)

(52) U.S. Cl.
CPC . *G06F 1/14* (2013.01); *G06F 1/08* (2013.01)

(58) Field of Classification Search
CPC .......................................................... G06F 1/08
See application file for complete search history.

(56) References Cited

U.S. PATENT DOCUMENTS

| 2009/0256610 | A1* | 10/2009 | Yoon | H03L 7/087 327/254 |
| 2012/0187994 | A1* | 7/2012 | Yang | H03D 7/1458 327/233 |
| 2015/0369903 | A1* | 12/2015 | Ghazinour | G01S 7/285 342/194 |
| 2019/0123728 | A1 | 4/2019 | Zhao et al. | |

FOREIGN PATENT DOCUMENTS

WO 2012100226 A1 7/2012

OTHER PUBLICATIONS

European Extended Search Report from European Patent Application No. 23154185.5, dated Jul. 5, 2023, pp. 1-11.

* cited by examiner

*Primary Examiner* — Stefan Stoynov
(74) *Attorney, Agent, or Firm* — Paradice & Li LLP

(57) ABSTRACT

Quadrature clock generation circuits and techniques are disclosed. An example quadrature clock generator includes an in-phase (I) clock generation circuit to generate an I clock signal based on a reference clock signal, the I clock signal and the reference clock signal each having a first frequency, a quadrature phase (Q) clock generation circuit to generate a Q clock signal based on the reference clock signal, a rise time control signal, and a fall time control signal, the Q clock signal having the first frequency, and a control circuit to generate the rise time control signal and the fall time control signal based on the I clock signal and the Q clock signal.

20 Claims, 10 Drawing Sheets

QUADRATURE CLOCK GENERATOR WITH DUTY CYCLE CORRECTOR

CROSS-REFERENCE TO RELATED APPLICATION

This application claims priority and benefit under 35 USC § 119(e) to U.S. Provisional Patent Application No. 63/306,408, filed on Feb. 3, 2022, which is incorporated herein by reference in its entirety.

TECHNICAL FIELD

This disclosure relates generally to circuits and techniques for digital clock generation, and more specifically to the generation of quadrature clock signals.

BACKGROUND OF RELATED ART

Electronic devices often employ clock signals for timing and synchronization. For example, quadrature clocks may include an in-phase clock signal, and a quadrature phase clock signal, where the quadrature phase clock signal has the same frequency and amplitude as the in-phase clock signal, but is shifted in phase by a quarter wavelength, in other words, shifted by 90° or π/2 radians.

Circuitry for generating such quadrature clock signals may be configured to maintain appropriate duty cycles, amplitudes, and frequencies for each of the in-phase and quadrature phase clock signals, as well as to maintain the quarter wavelength phase difference between the in-phase clock signal and the quadrature phase clock signal.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

In some aspects of the present disclosure, circuits and techniques for quadrature clock generation are disclosed. An example quadrature clock generator includes an in-phase (I) clock generation circuit to generate an I clock signal based on a reference clock signal, the I clock signal and the reference clock signal each having a first frequency, a quadrature phase (Q) clock generation circuit to generate a Q clock signal based on the reference clock signal, a rise time control signal, and a fall time control signal, the Q clock signal having the first frequency, and a control circuit to generate the rise time control signal and the fall time control signal based on the I clock signal and the Q clock signal.

In further aspects of the present disclosure, further circuits and techniques for quadrature clock generation are disclosure. An example quadrature clock generator includes an in-phase (I) clock generation circuit to generate an I clock signal by delaying a reference clock signal, the I clock signal and the reference clock signal each having a first frequency, a quadrature phase (Q) clock generation circuit to generate a Q clock signal by delaying and adjusting a rise time and a fall time of the reference clock signal, the Q clock signal having the first frequency and having a phase offset of 90° with respect to the I clock signal, and a control circuit to determine a rise time control signal and a fall time control signal for adjusting the rise time and fall time of the Q clock signal based at least in part on the I clock signal and the Q clock signal.

In further aspects of the present disclosure, circuits and techniques for dual rail quadrature clock generation are disclosure. An example dual rail quadrature clock generator includes an in-phase (I) clock generation circuit to generate a noninverted I clock signal and an inverted I clock signal based on a noninverted reference clock signal and an inverted reference clock signal, the noninverted I clock signal, the inverted I clock signal, the noninverted reference clock signal and the inverted reference clock signal each having a first frequency, a quadrature phase (Q) clock generation circuit to generate a noninverted Q clock signal and an inverted Q clock signal based on the noninverted reference clock signal, the inverted reference clock signal, the noninverted I clock signal, and the inverted Q clock signal, wherein the noninverted Q clock signal and the inverted Q clock signal have the first frequency, and a control circuit to generate a rise time control signal and a fall time control signal for adjusting a rise time and a fall time of the noninverted Q clock signal and the inverted Q clock signal, wherein the rise time control signal and the fall time control signal are generated based on the noninverted I clock signal and the inverted Q clock signal.

BRIEF DESCRIPTION OF THE DRAWINGS

The present embodiments are illustrated by way of example and are not intended to be limited by the figures of the accompanying drawings.

DETAILED DESCRIPTION

Figure 1A:
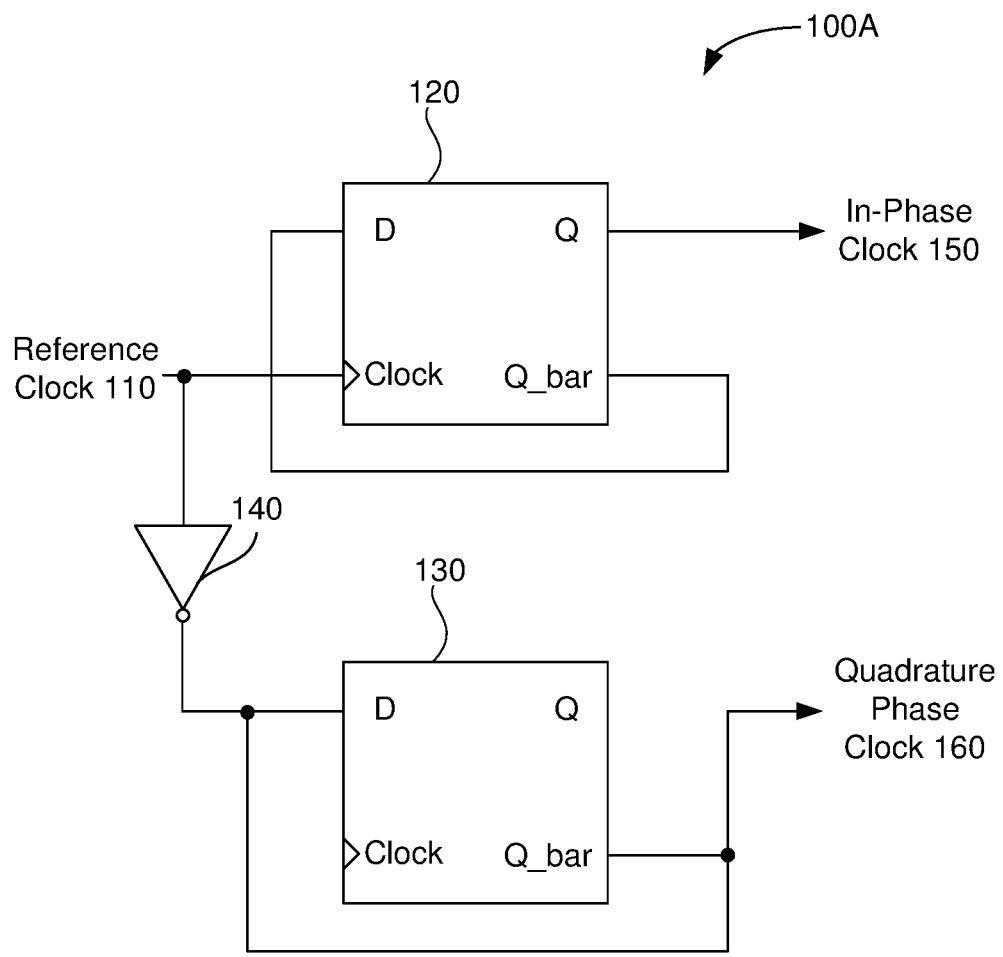
FIG. 1A shows a conventional digital phase splitter circuit. which may be used to generate quadrature clock signals.

In the following description, numerous specific details are set forth such as examples of specific components, circuits, and processes to provide a thorough understanding of the present disclosure. The term "coupled" as used herein means connected directly to or connected through one or more intervening components or circuits. The terms "electronic system" and "electronic device" may be used interchangeably to refer to any system capable of electronically processing information. Also, in the following description and for purposes of explanation, specific nomenclature is set forth to provide a thorough understanding of the aspects of the disclosure. However, it will be apparent to one skilled in the art that these specific details may not be required to practice the example implementations. In other instances, well-known circuits and devices are shown in block diagram form to avoid obscuring the present disclosure. Some portions of the detailed descriptions which follow are presented in terms of procedures, logic blocks, processing and other symbolic representations of operations on data bits within a computer memory.

These descriptions and representations are the means used by those skilled in the data processing arts to most effectively convey the substance of their work to others skilled in the art. In the present disclosure, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system. It should be borne in mind, however, that all of these and similar terms are to be associated with the appropriate physical quantities and are merely convenient labels applied to these quantities.

Unless specifically stated otherwise as apparent from the following discussions, it is appreciated that throughout the present disclosure, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described below generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the example input devices may include components other than those shown, including well-known components such as a processor, memory and the like.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, performs one or more of the methods described above. The non-transitory processor-readable data storage medium may form part of a computer program product, which may include packaging materials.

Various implementations relate generally to the generation of quadrature clock signals. Some implementations more specifically relate to quadrature clock generators included in integrated circuits. In one implementation, an in-phase (I) clock generation circuit generates an I clock signal based on a reference clock signal, such as by delaying the reference clock signal. Thus, the I clock signal has the same frequency as the reference clock signal. A quadrature phase (Q) clock generation circuit generates a Q clock signal based on the reference clock signal, a rise time control signal, and a fall time control signal. The Q clock signal has the same frequency as the I clock signal (and the reference clock signal) but is offset in phase by 90 degrees with respect to the I clock signal. A control circuit generates the rise time control signal and the fall time control signal based on the I clock signal and the Q clock signal. The rise time control signal and the fall time control signal are used by the Q clock generation circuit in order to maintain the 90 degrees phase offset between the I clock signal and the Q clock signal and to maintain the proper 50% duty cycle for the Q clock signal.

Particular implementations of the subject matter described in this disclosure can be implemented to realize one or more of the following potential advantages. In some implementations, rather than requiring a reference clock signal which is twice the frequency of the desired quadrature clock signals, as in some conventional clock generation circuits, the reference clock signal or signals required for the example implementations have the same frequency as the quadrature clock signals generated by the example circuits. This may result in reduced power consumption and heat generation. Further, the example implementations may generate the quadrature clock signals accurately, by determining the phase difference between the I and Q clock signals and correcting for phase mismatch by locking the delay to a 90 degree phase delay between the I and Q clock signals. Further, the example implementations may correct any duty cycle mismatches in the Q clock signals in order to ensure accurate clock signal generation for a wide variety of desired clock frequencies.

FIG. 1A shows a conventional digital phase splitter circuit 100A, which may be used to generate quadrature clock signals. The digital phase splitter circuit 100A may include a first flip-flop 120, a second flip-flop 130, and an inverter 140. Note that, while the first flip-flop 120 and second flip-flop 130 are shown as D flip-flops, other conventional digital phase splitter circuits may use other types of flip-flops or latches.

The first flip-flop 120 may be clocked by a reference clock signal 110, while an in-phase clock 150 may be generated at the output Q. The output Q_bar may be provided at the input D of the first flip-flop 120. The reference clock 110 may be provided to the inverter 140, and the output of the inverter 140 is provided to the input D and the output Q_bar of the second flip-flop 130. The quadrature phase clock 160 may be generated at the output Q_bar of the second flip-flop 130. As such, the in-phase clock 150 and the quadrature-phase clock 160 may each have a frequency which is half that of the reference clock 110. In other words, for a desired frequency of the clock signals 150 and 160, a reference clock 110 having twice the frequency is required.

Figure 1B:
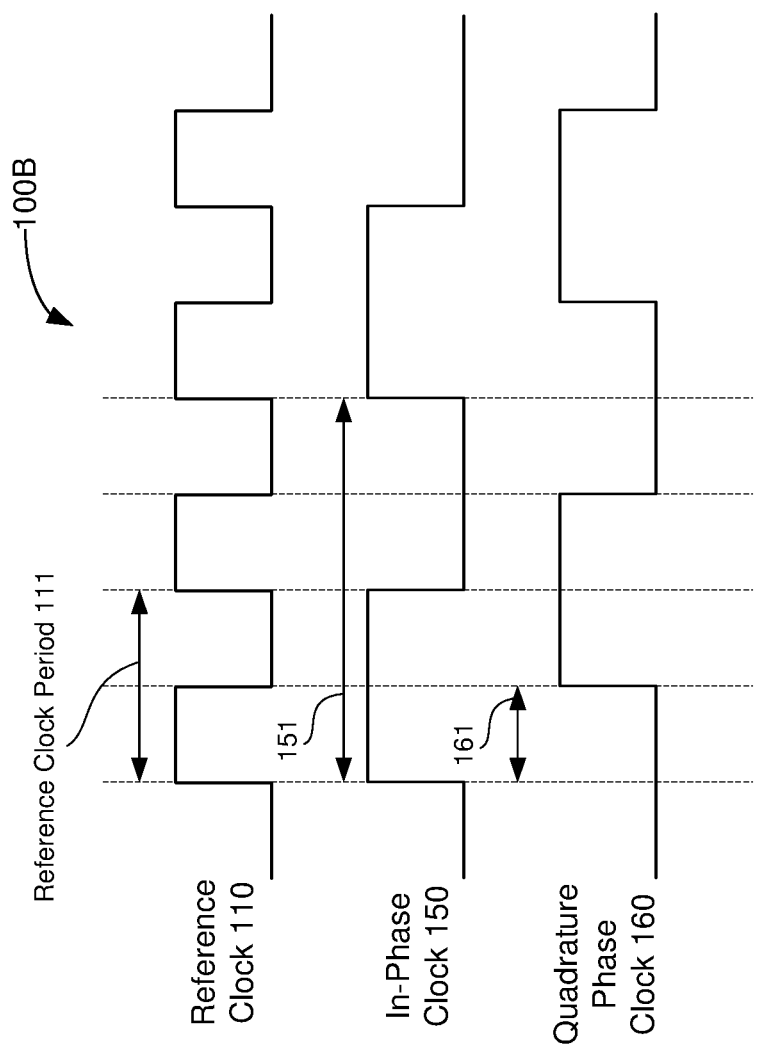
FIG. 1B shows a timing diagram of the input and output signals of the digital phase splitter circuit of FIG. 1A.

FIG. 1B shows a timing diagram 100B of the input and output signals of the digital phase splitter circuit 100A. Note that the reference clock 110 has twice the frequency of the in-phase clock 150 and twice the frequency of the quadrature phase clock 160. In other words, the reference clock period 111 is half of the output clock period 151. Additionally, note that the phase offset 161 between the quadrature phase clock 160 and the in-phase clock 150 is one quarter of the output clock period 161.

Figure 2:
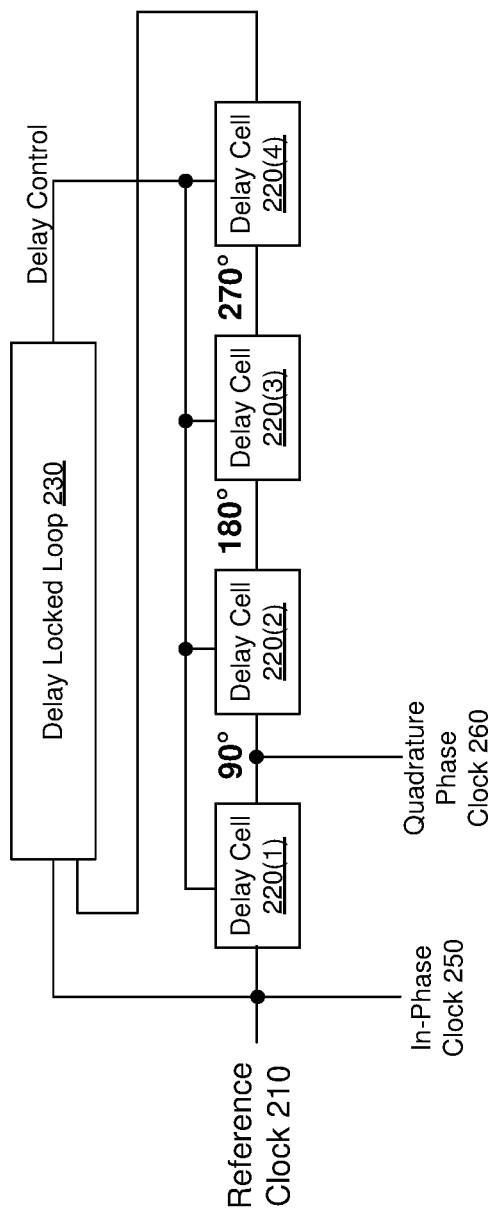
FIG. 2 shows a conventional delay locked loop (DLL) circuit for generating quadrature clock signals.

FIG. 2 shows a conventional delay locked loop (DLL) circuit 200 for generating quadrature clock signals. The DLL circuit 200 includes four delay cells 220(1)-220(4) (collectively delay cells 220). Each delay cell is configured to delay a reference clock 210 by one quarter wavelength. For example, each delay cell of the delay cells 220 may include an inverter and a capacitor, or another suitable circuit for delaying an input signal. Thus, at the output of the first delay cell 220(1), the reference clock 210 may be delayed by one quarter wavelength, or 90 degrees. The remaining delay stages may have identical structure, such that the second delay cell 220(2) outputs a signal corresponding to the reference clock 210 which has been delayed by one half wavelength, or 180 degrees. Similarly, the third delay call 220(3) outputs a signal corresponding to the reference clock 210 delayed by three quarters of a wavelength, or 270 degrees, and the fourth delay cell 220(4) outputs a signal which should be in phase with the reference clock 210. The DLL circuit 200 outputs an in-phase clock 250, which may simply be the reference clock 210, and a quadrature phase clock 260, which may be the output of the first delay cell 220(1).

The DLL circuit 200 also includes a delay locked loop 230, which may receive the reference clock 210 and the output of the fourth delay cell 220(4) and generate delay control signals for the delay cells 220. The delay locked loop 230 may generate the delay control signals to correct for any mismatch between the reference clock 210 and the output of the delay cell 220(4), which should be identical and in phase with the reference clock 210.

While the digital phase splitter circuit 100A and the DLL circuit 200 may be used to generate quadrature clock signals, they each have drawbacks. For example, the digital phase splitter circuit 100A requires a reference clock signal having twice the frequency of the desired quadrature clock signals. This may result in undesirably high power consumption or circuit complexity for generating such high frequency reference clock signals. For example, chip to chip speeds are increasing due to the bandwidth needs of high-capacity network and high-performance computer systems, which may use high resolution video applications such as 4k and 8k. Further, interfaces may be required to support a variety of data rates as well, such as 5.4 Gbps, 6.75 Gbps, 8.1 Gbps, 10 Gbps, 13.5 Gbps, 20 Gbps, and so on, for backward compatibility and for low power consumption. Also, the digital phase splitter circuit 100A cannot easily adjust for inaccurate duty cycles or phase offsets, which may result in inaccurate clock signals.

Use of the DLL circuit 200 may result in a quadrature clock 260 having a distorted duty cycle, as the duty cycle is not controlled and may be distorted by the delay cells 220 of the DLL circuit 200. Further, the DLL circuit 200 may experience harmonic locking issues, when the delay provided by the delay locked loop 230 and the delay cells 220 may not lock to one wavelength, but may lock to an integer N number of wavelengths. This may result in functional issues with the DLL circuit 200, or may require additional circuitry to avoid these harmonic locking issues. Further, the delay cells 220 are difficult to match, and may not each provide precisely the same amount of delay, which may result in IQ phase delay errors due to this delay cell mismatch.

It would therefore be desirable to generate quadrature clock signals for a wide range of clock frequencies without requiring a double frequency reference clock, and which may accurately maintain required phase offset and duty cycle timing between the generated quadrature clock signals.

The example implementations may generate quadrature clock signals using fully differential amplifier circuitry, and which may detect the phase difference between the in-phase (I) and quadrature phase (Q) clock signals using phase detection, and adjust the phase offset and duty cycle of the Q clock signals to maintain its desired quarter wavelength offset and 50% duty cycle.

Figure 3:
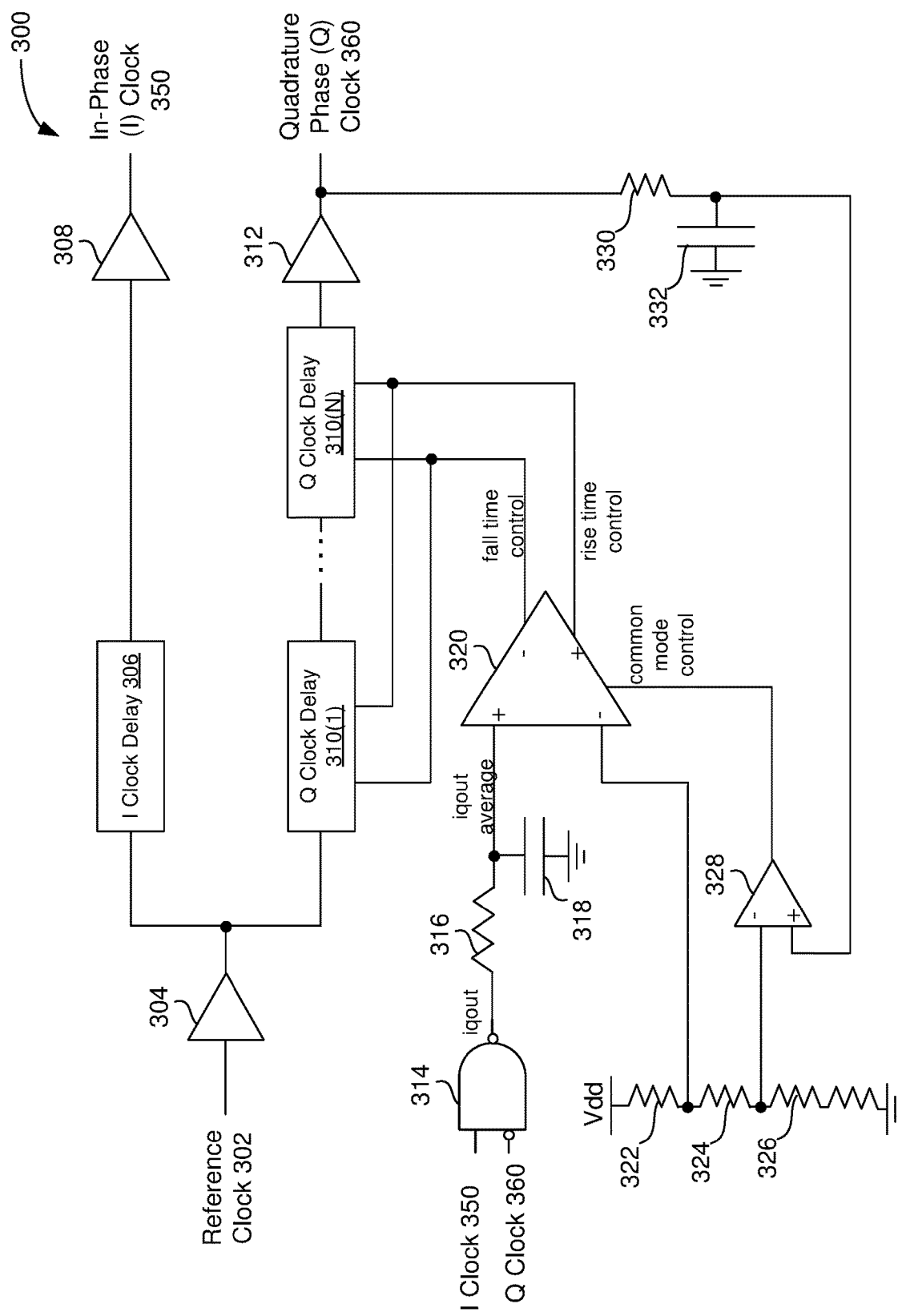
FIG. 3 shows an example quadrature clock generator, according to some implementations.

FIG. 3 shows an example quadrature clock generator 300, according to some implementations. The quadrature clock generator 300 receives a reference clock 302, which may optionally be buffered by a buffer 304. The buffered reference clock 302 may be provided to an I clock delay circuit 306 and one or more Q clock delay circuits 310(1)-310(N) (collectively Q clock delay circuits 310). The I clock delay circuit may delay the reference clock 302, generating an I clock 350 which may optionally be buffered by a buffer 308. This I clock 350 has the same frequency as the reference clock 302. The Q clock delay circuits 310 may each delay and adjust a phase offset and duty cycle of the reference clock 302 in order to generate the Q clock 360, which may optionally be buffered by a buffer 312. As with the I clock 350, the Q clock 360 also has the same frequency as the reference clock 302, but is shifted in phase by one quarter wavelength. Each Q clock delay circuit 310 may also receive a fall time control signal and a rise time control signal, which may be used by the Q clock delay circuits 310 to adjust the phase offset and duty cycles, as discussed in more detail below.

The fall time control signal and the rise time control signal may be generated by a control circuit including a NAND gate 314, a resistor 316, a capacitor 318, a differential amplifier 320, resistors 322, 324, and 326, an amplifier 328, a resistor 330, and a capacitor 332. The NAND gate 314 may receive the I clock 350 at a noninverting input, and the Q clock 360 at an inverting input, outputting an "iqout" signal, which may correspond to a phase difference between the I clock 350 and the Q clock 360. For example, when the I clock 350 and the Q clock 360 have the desired quarter wavelength, or 90 degree, phase difference, the iqout signal may have a 75% duty cycle. Note that in some aspects the NAND gate 314 may be replaced by a suitable IQ phase detect circuit, as described below.

The resistor 316 and capacitor 318 may generate an "iqout average" signal representing an average value of iqout. Thus, when the I clock 350 and Q clock 360 have proper phase difference of 90 degrees, iqout average has a value of 75% of a supply voltage of the quadrature clock generator 300, such as 75% of Vdd. Iqout average may be provided at a noninverting input of the differential amplifier 320. The resistors 322, 324, and 326 may be used to generate another signal having a value of 75% of Vdd, which may be provided at an inverting input of the differential amplifier 320. In this manner, the fall time control signal, provided from an inverting output of the differential amplifier 320, and the rise time control signal, provided from a noninverting output of the differential amplifier 320, may be based on the phase offset between the I clock 350 and the Q clock 360.

The quadrature clock generator 300 may also provide duty cycle correction for the Q clock 360. For example, the output common mode voltage control for the differential amplifier 320 may be provided from an output of the amplifier 328. The amplifier 328 has an inverting input coupled to receive a signal having a value of 50% of Vdd, corresponding to an intended 50% duty cycle of the Q clock 360. A noninverting input of the amplifier 328 may be coupled to receive a signal corresponding to an average value of the Q clock 360. This average value of the Q clock 360 may be generated from the Q clock 360 using the resistor 330 and the capacitor 332. The output of the amplifier 328 controls rise time and fall time of Q clock delay circuits 310 by controlling the output common mode voltage of the differential amplifier 320 to adjust Q clock 360 duty cycle to 50% because the output of the amplifier 328 is based on a difference between the desired 50% duty cycle of Q clock 360— represented by the inverting input to the amplifier 328—and the actual duty cycle of the Q clock 360—represented by the noninverting input to the amplifier 328.

Note that while the averaging circuits in FIG. 3 are shown as a resistor and a capacitor, such as the resistor 316 and capacitor 318, that in other aspects other suitable circuits may be used for generating the average signal values.

Figure 4:
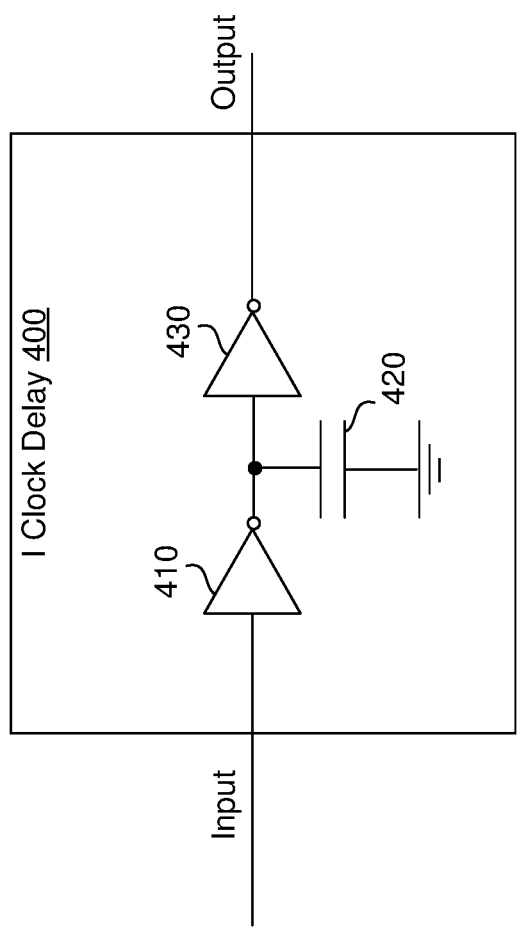
FIG. 4 shows an example I clock delay circuit, which may be one example of the I clock delay circuit shown in FIG. 3.

FIG. 4 shows an example I clock delay circuit 400, which may be one example of the I clock delay circuit 306 shown in FIG. 3. The I clock delay circuit 400 may include a simple inverter chain, such as including the inverters 410 and 430. In other aspects, the I clock delay circuits may include any number of inverters, provided that the output is not inverted with respect to the input. The I clock delay circuit 400 may also include a capacitor 420. Note that for higher frequency clocks, for example for 10 GHz clock, that a minimum delay for the Q clock delay circuits may be higher than the desired 90 degree phase difference between the I and Q clocks. Example quadrature clock generator circuits for such high frequency clocks may include an artificial delay added to the I clock delay circuits, such as the I clock delay circuits 306 or 400, in order to reduce the I clock to Q clock phase delay difference to the desired 90 degrees.

Figure 5:
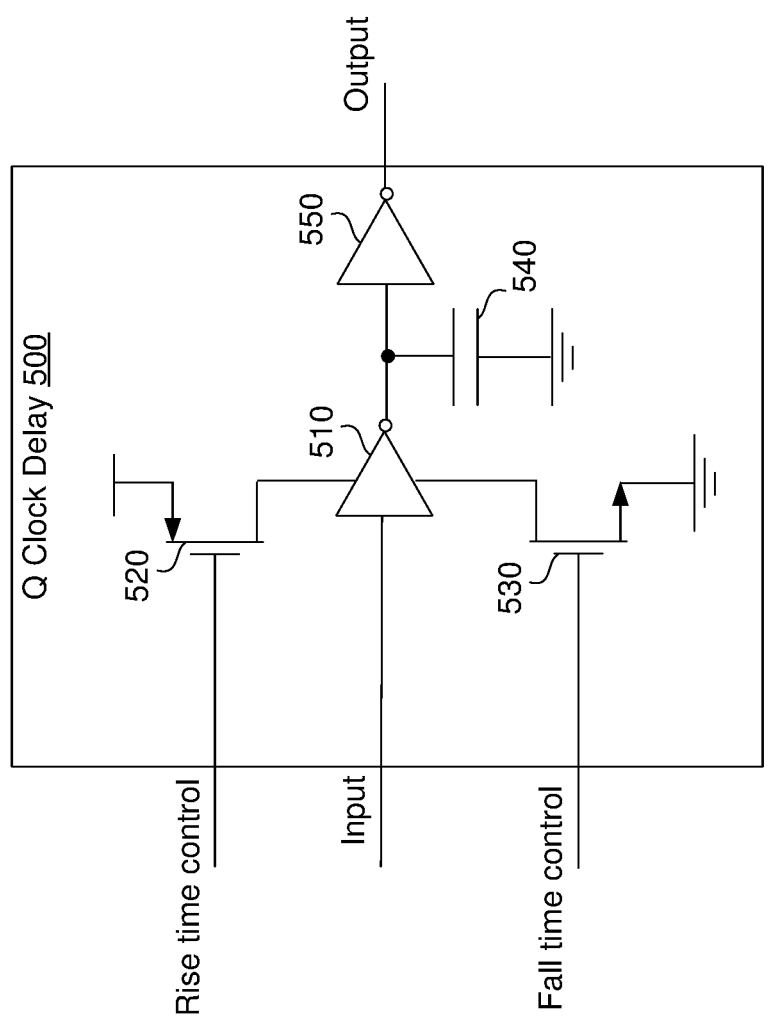
FIG. 5 shows an example Q clock delay circuit, which may be one example of each of the Q clock delay circuits of FIG. 3.

FIG. 5 shows an example Q clock delay circuit 500, which may be one example of each of the Q clock delay circuits 310 of FIG. 3. The Q clock delay circuit 500 may receive the rise time control signal and the fall time control signal, such as from the differential amplifier 320. The Q clock delay circuit 500 may also receive an input, such as the reference clock 302, or an output from a previous Q clock delay circuit. This input signal may be provided to an inverter 510. A supply terminal of the inverter 510 may be coupled to a drain terminal of a transistor 520, which may be a P-channel metal-oxide-semiconductor (PMOS) transistor. A source terminal of the transistor 520 may be coupled to a supply voltage, and a gate terminal of the transistor 520 may be coupled to the rise time control signal. A ground terminal of the inverter 510 may be coupled to a drain terminal of a transistor 530, which may be an N-channel metal-oxide-semiconductor (NMOS) transistor. A source terminal of the transistor 530 may be coupled to ground, and a gate terminal of the transistor 530 may be coupled to the fall time control signal. An output of the inverter 510 may be coupled to the capacitor 540 and the inverter 550. The output of the inverter 550 may be provided as the output of the Q clock delay circuit 500.

The Q clock delay cell may be controlled using the rise time control signal and fall time control signal. For example, when the rise time control signal increases, the rise time delay increases for the Q clock, due to the transistor 520 becoming weaker. Similarly, when the rise time control signal decreases, the rise time delay decreases for the Q clock, as the transistor 520 becomes stronger. As the fall time control signal increases, the transistor 530 becomes stronger, and the fall time decreases for the Q clock. Similarly, when the fall time control signal decreases, the fall time delay increases for the Q clock.

Figure 6A:
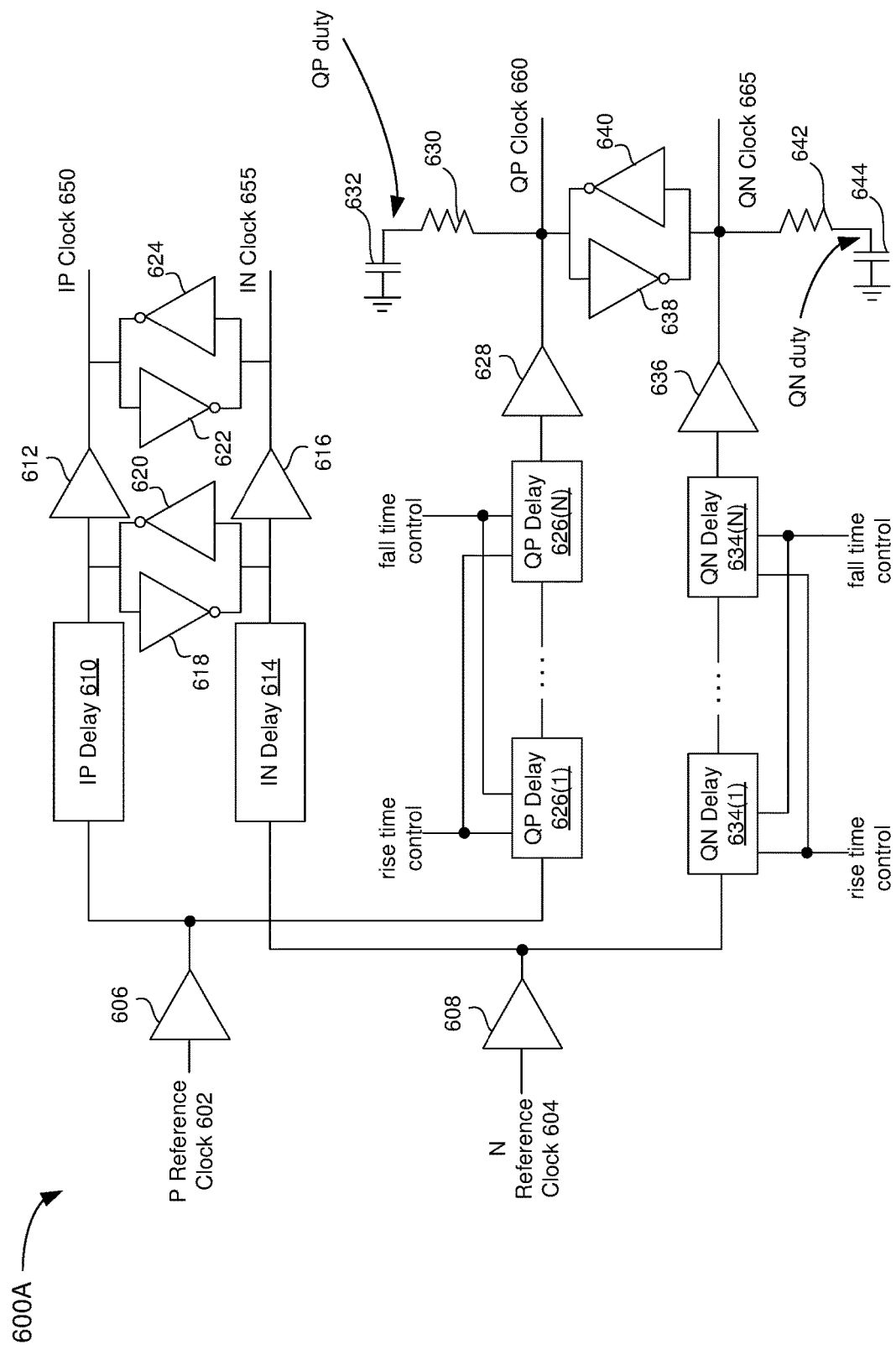
FIG. 6A shows an example quadrature clock generator for a dual rail quadrature clock generation circuit, according to some implementations.

In some aspects, the quadrature clock generators of the present disclosure may be provided for dual rail circuits. For example, FIG. 6A shows an example quadrature clock generator 600A for a dual rail quadrature clock generation circuit, according to some implementations. Rather than a single reference clock, as with FIG. 3, a noninverted reference clock, P reference clock 602, and an inverted reference clock, N reference clock 604, may be provided to the quadrature clock generator 600A, optionally after being buffered by respective buffers 606 and 608. The P reference clock may be provided to IP delay circuit 610, which may delay the P reference clock 602, and may include an inverter chain, such as with I clock delay circuit 400. The output of the IP delay circuit 610 may, after optionally being buffered by buffer 612, be provided as a noninverted I clock signal, IP clock 650. The N reference clock 604 may be provided to IN delay circuit 614, which may delay the N reference clock 604, and may also include an inverter chain, such as with I clock delay circuit 400. The output of the IN delay circuit 614 may, after optionally being buffered by buffer 616, be provided as an inverted I clock signal, IN clock 655.

The Q clocks, a noninverted Q clock 660 and an inverted Q clock 665, may also be generated similarly to FIG. 3. For example, the P reference clock 602 may be provided to one or more QP delay circuits 626(1)-626(N) (collectively QP delay circuits 626), each of which may receive a rise time control signal and a fall time control signal. After optionally being buffered by buffer 628, the output of the QP delay circuits 626 may be provided as the QP clock 660. The QP clock 660 may also be coupled to the resistor 630 and the capacitor 632, and the signal at a node between the resistor 630 and the capacitor 632 may be referred to as QP duty. Further, the N reference clock 604 may be provided to one or more QN delay circuits 634(1)-634(N) (collectively QN delay circuits 634), each of which may receive a rise time control signal and a fall time control signal. After optionally being buffered by buffer 636, the output of the QN delay circuits 634 may be provided as the QN clock 665. The QN clock 665 may also be coupled to the resistor 642 and the capacitor 644, and the signal at a node between the resistor 642 and the capacitor 644 may be referred to as QN duty.

Note that the QP delay circuits 626 and QN delay circuits 634 may have the same structure as the Q clock delay circuits 310 or the Q clock delay circuit 500.

The separation of complementary rails, such as that of the IP clock 650 and IN clock 655, as well as of the QP clock 660 and QN clock 665, may be maintained using any suitable techniques, such as using the inverter pairs 618/620, 622/624, and 638/640.

Figure 6B:
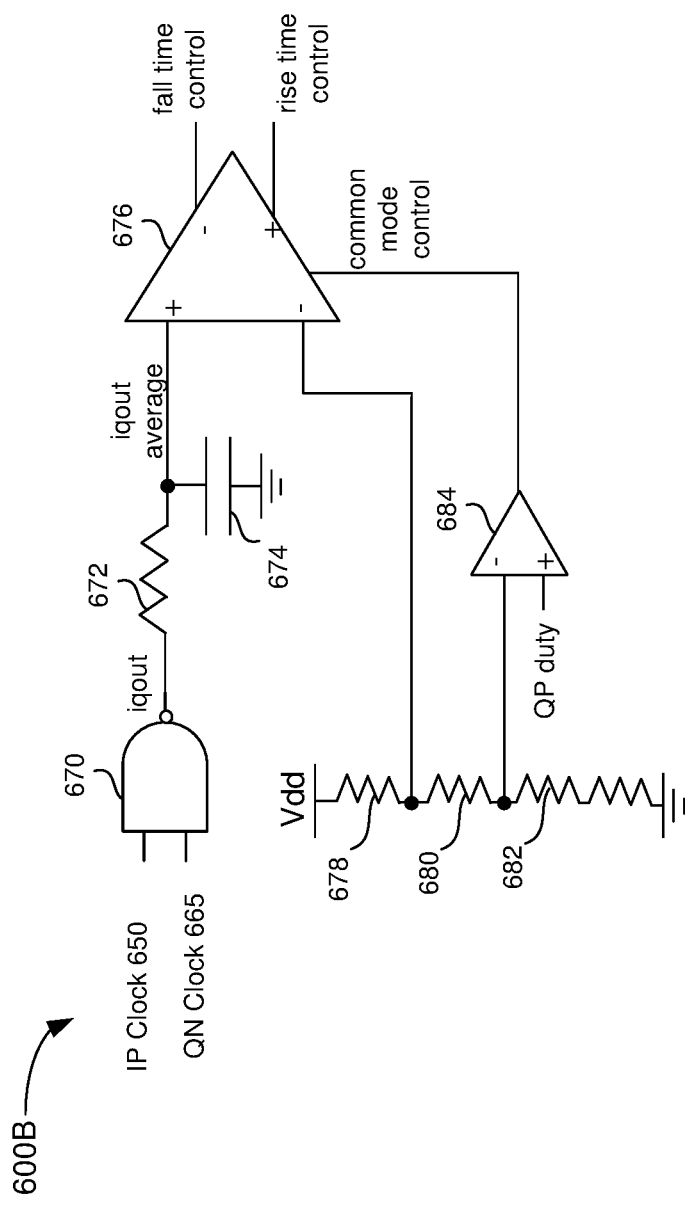
FIG. 6B shows an example control circuit for the quadrature clock generator of FIG. 6A

The rise time control signal and fall time control signal may be generated similarly to the control circuit of FIG. 3. FIG. 6B shows an example control circuit 600B for the quadrature clock generator 600A of FIG. 6A. The IP clock 650 and the QN clock 665 may be provided to a NAND gate 670, whose output is iqout. Similarly to FIG. 3, iqout is averaged using a resistor 672 and a capacitor 674 and provided at a noninverting input to a differential amplifier 676. An inverting input to the differential amplifier 676 may be a signal having a value corresponding to 75% of a supply voltage of the quadrature clock generator 600A. For example, this signal may be generated using resistors 678, 680, and 682 coupled between Vdd and ground. An output common mode voltage control to the differential amplifier 676 may be provided from an output of an amplifier 684. An inverting input of the amplifier 684 may be a signal having a value corresponding to 50% of Vdd, and a noninverting input of the amplifier 684 may be the signal QP duty shown in FIG. 6A. The rise time control signal and the fall time control signal may be the respective inverting and noninverting outputs of the differential amplifier 676.

Figure 7:
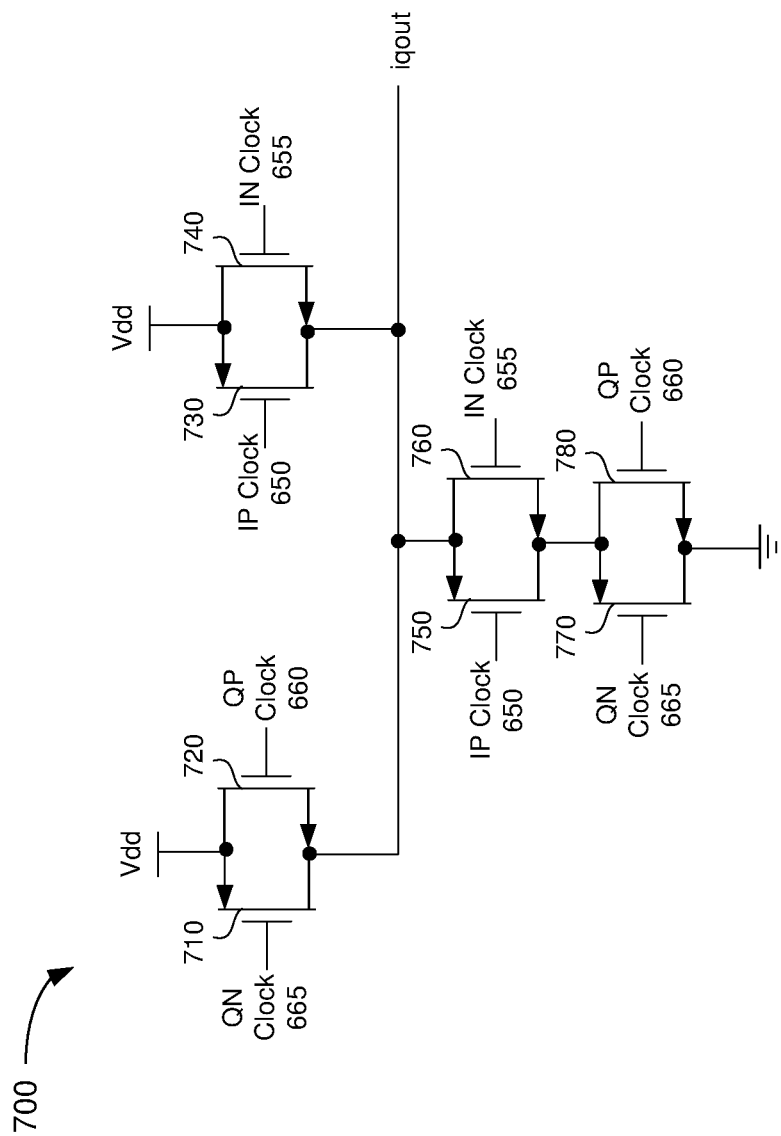
FIG. 7 shows an example IQ phase detection circuit which may be used with the dual rail quadrature clock generation circuit of FIG. 6A, according to some implementations.

While the iqout signal is shown in FIG. 3 and FIG. 6B as being generated by a NAND gate, such the NAND gate 314 or the NAND gate 670, in some other aspects, iqout may be generated using an IQ phase detection circuit. FIG. 7 shows an example IQ phase detection circuit 700 which may be used with the dual rail quadrature clock generation circuit 600A of FIG. 6A, according to some implementations. A first pair of transistors 710 and 720 may each be coupled between a supply voltage, such as Vdd, and iqout. The transistor 710 may have a source terminal coupled to Vdd, a gate terminal coupled to the QN clock 665, and a drain terminal coupled to iqout. The transistor 720 may have a drain terminal coupled to Vdd, a gate terminal coupled to QP clock 660, and a source terminal coupled to iqout. A second pair of transistors 730 and 740 may be coupled between Vdd and iqout. The transistor 730 may have a source terminal coupled to Vdd, a gate terminal coupled to IP clock 650, and a drain terminal coupled to iqout. The transistor 740 may have a drain terminal coupled to Vdd, a gate terminal coupled to IN clock 655, and a source terminal coupled to iqout.

A third pair of transistors 750 and 760, and a fourth pair of transistors 770 and 780 may be coupled between iqout and ground. The transistor 750 may have a source terminal coupled to iqout, a gate terminal coupled to IP clock 650, and a drain terminal coupled to a common node between the third pair of transistors 750/760 and the fourth pair of transistors 770/780. The transistor 760 may have a source terminal coupled to the common node between the third pair of transistors 750/760 and the fourth pair of transistors 770/780, a drain terminal coupled to iqout, and a gate terminal coupled to IN clock 655. The transistor 770 may have a source terminal coupled to the common node, a gate terminal coupled to QN clock 665, and a drain terminal coupled to ground. The transistor 780 may have a drain terminal coupled to the common node, a gate terminal coupled to QP clock 660, and a source terminal coupled to ground.

Use of the IQ phase detection circuit 700 shown in FIG. 7 rather than a NAND gate, such the NAND gate 314 or the NAND gate 670, may provide several advantages. For example, then the transistor sizes are the same, charge injection error may be reduced. Additionally, loading to all clocks may be identical, which may aid in matching the rise time and fall time of each clock. To reduce the variation between rise times and fall times of each clock, the sizes of pull-up network devices and pull-down network devices may be configured to match the rise time and fall time of the iqout signal.

Figure 8:
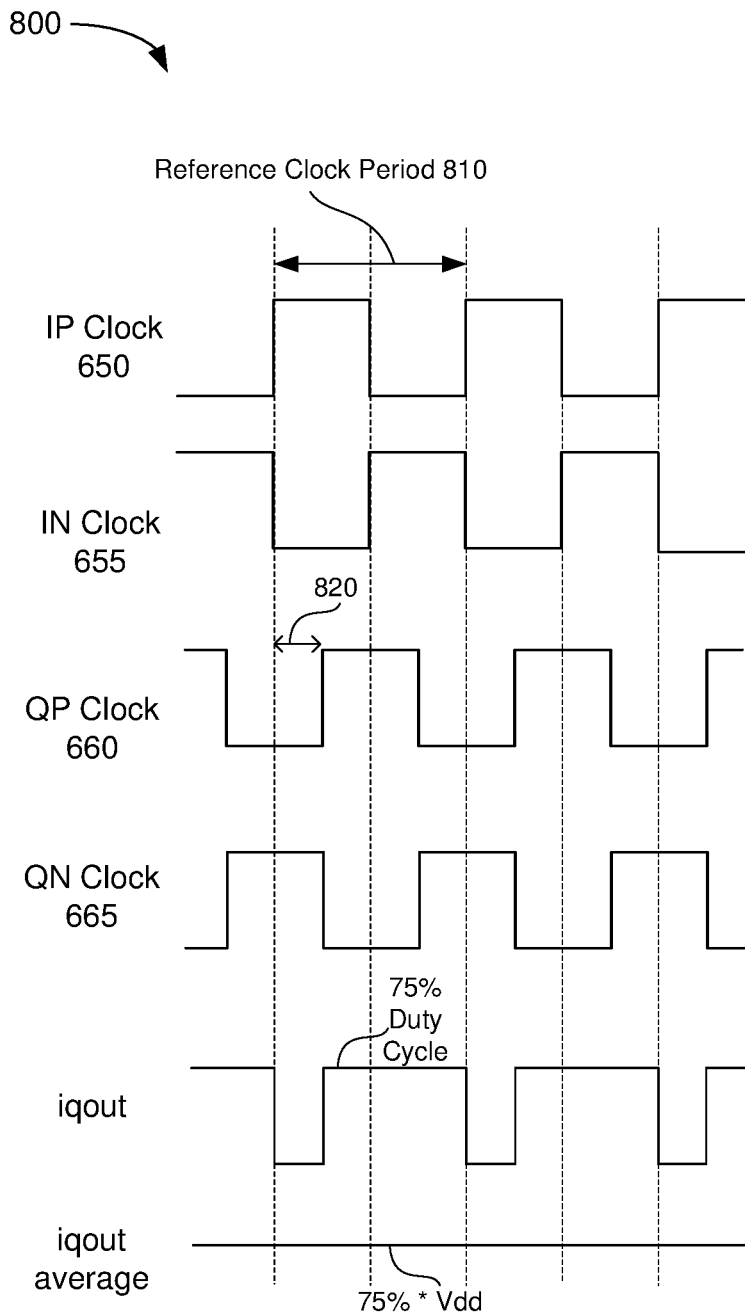
FIG. 8 shows a timing diagram of the input and output signals of the dual rail quadrature clock generation circuit of FIG. 6A, according to some implementations.

FIG. 8 shows a timing diagram 800 of the input and output signals of the dual rail quadrature clock generation circuit 600A of FIG. 6A. As shown with respect to FIG. 8, the IP clock 650 and IN clock 655 are inverted but share a common reference clock frequency, shown by the reference clock period 810. Similarly, the QP clock 660 and the QN clock 665 share the same clock frequency and reference clock period 810, but are shifted in phase by a quarter wavelength, or 90 degrees, as shown by the phase difference 820. As described above, the iqout signal has a duty cycle of 75%, corresponding to the phase difference between the in phase clock signals IP clock 650 and IN clock 655 and the quadrature phase clock signals QP clock 660 and QN clock 655. The iqout average signal, representing an averaged value of the iqout signal, has a value corresponding to 75% of Vdd.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

In the foregoing specification, embodiments have been described with reference to specific examples thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A quadrature clock generator, comprising:
    an in-phase (I) clock generation circuit to generate an I clock signal based on a reference clock signal, the I clock signal and the reference clock signal each having a first frequency;
    a quadrature phase (Q) clock generation circuit to generate a Q clock signal based on the reference clock signal, a rise time control signal, and a fall time control signal, the Q clock signal having the first frequency; and
    a control circuit to generate the rise time control signal and the fall time control signal based on the I clock signal and the Q clock signal.

2. The quadrature clock generator of claim 1, wherein the I clock generation circuit comprises a delay circuit configured to delay the reference clock signal.

3. The quadrature clock generator of claim 1, wherein the Q clock generation circuit comprises a plurality of Q clock delay cells, each Q clock delay cell coupled to the rise time control signal and the fall time control signal.

4. The quadrature clock generator of claim 3, wherein each Q clock delay cell comprises:
    a first inverter having an input terminal, a power terminal, a ground terminal, and an output terminal;
    a first transistor having a gate terminal coupled to the rise time control signal, a source terminal coupled to a supply voltage, and a drain terminal coupled to the power terminal of the first inverter; and
    a second transistor having a gate terminal coupled to the fall time control signal, a source terminal coupled to a ground voltage, and a drain terminal coupled to the ground terminal of the first inverter.

5. The quadrature clock generator of claim 1, wherein the control circuit includes a differential amplifier comprising:
    a noninverting input terminal to receive an iqout average signal, the iqout average signal representing an average value of the I clock signal NAND an inverted Q clock signal;
    an inverting input terminal to receive a signal representing 75% of a supply voltage of the quadrature clock generator;

a terminal to receive an output common mode voltage signal;
an inverting output to provide the fall time control signal; and
a noninverting output to provide the rise time control signal.

6. The quadrature clock generator of claim 5, wherein the output common mode voltage signal is generated by an amplifier having an inverting input to receive a constant voltage signal representing 50% of the supply voltage, a noninverting input to receive a signal representing an average value of the Q clock signal, and an output terminal to provide the output common mode voltage signal.

7. The quadrature clock generator of claim 1, wherein the control circuit is further configured to determine the rise time control signal and the fall time control signal based at least in part on a difference between a duty cycle of the Q clock signal and 50% of a supply voltage of the quadrature clock generator.

8. A quadrature clock generator, comprising:
an in-phase (I) clock generation circuit to generate an I clock signal by delaying a reference clock signal, the I clock signal and the reference clock signal each having a first frequency;
a quadrature phase (Q) clock generation circuit to generate a Q clock signal by delaying and adjusting a rise time and a fall time of the reference clock signal, the Q clock signal having the first frequency and having a phase offset of 90° with respect to the I clock signal; and
a control circuit to determine a rise time control signal and a fall time control signal for adjusting the rise time and fall time of the Q clock signal based at least in part on the I clock signal and the Q clock signal.

9. The quadrature clock generator of claim 8, wherein the Q clock generation circuit comprises a plurality of Q clock delay cells, each Q clock delay cell coupled to the rise time control signal and the fall time control signal.

10. The quadrature clock generator of claim 8, wherein the rise time delay increases when the rise time control signal increases, and the rise time delay decreases when the rise time control signal decreases.

11. The quadrature clock generator of claim 8, wherein the fall time delay decreases when the fall time control signal increases, and the fall time delay increases when the fall time control signal decreases.

12. The quadrature clock generator of claim 8, wherein the control circuit is configured to determine the rise time control signal and the fall time control signal based at least in part on the phase offset between the I clock signal and the Q clock signal.

13. The quadrature clock generator of claim 8, wherein the control circuit is configured to determine the phase offset between the I clock signal and the Q clock signal based on a logic NAND between the I clock signal and an inverted Q clock signal.

14. The quadrature clock generator of claim 8, wherein the control circuit is further configured to determine the rise time control signal and the fall time control signal based at least in part on a difference between a duty cycle of the Q clock signal and 50% of a supply voltage of the quadrature clock generator.

15. A dual rail quadrature clock generator, comprising:
an in-phase (I) clock generation circuit to generate a noninverted I clock signal and an inverted I clock signal based on a noninverted reference clock signal and an inverted reference clock signal, the noninverted I clock signal, the inverted I clock signal, the noninverted reference clock signal and the inverted reference clock signal each having a first frequency;
a quadrature phase (Q) clock generation circuit to generate a noninverted Q clock signal and an inverted Q clock signal based on the noninverted reference clock signal, the inverted reference clock signal, the noninverted I clock signal, and the inverted Q clock signal, wherein the noninverted Q clock signal and the inverted Q clock signal have the first frequency; and
a control circuit to generate a rise time control signal and a fall time control signal for adjusting a rise time and a fall time of the noninverted Q clock signal and the inverted Q clock signal, wherein the rise time control signal and the fall time control signal are generated based on the noninverted I clock signal and the inverted Q clock signal.

16. The dual rail quadrature clock generator of claim 15, wherein the I clock generation circuit comprises a first I delay circuit configured to delay the noninverted reference clock signal to generate the noninverted I clock signal and a second I delay circuit configured to delay the inverted reference clock signal to generate the inverted I clock signal.

17. The dual rail quadrature clock generator of claim 15, wherein the Q clock generation circuit comprises:
a plurality of first Q clock delay cells, each first Q clock delay cell configured to receive the noninverted reference clock signal, the rise time control signal and the fall time control signal; and
a plurality of second Q clock delay cells, each second Q clock delay cell configured to receive the inverted reference clock signal, the rise time control signal, and the fall time control signal.

18. The dual rail quadrature clock generator of claim 17, wherein each first Q clock delay cell and each second Q clock delay cell comprises:
a first inverter having an input terminal, a power terminal, a ground terminal, and an output terminal;
a first transistor having a gate terminal coupled to the rise time control signal, a source terminal coupled to a supply voltage, and a drain terminal coupled to the power terminal of the first inverter; and
a second transistor having a gate terminal coupled to the fall time control signal, a source terminal coupled to a ground voltage, and a drain terminal coupled to the ground terminal of the first inverter.

19. The dual rail quadrature clock generator of claim 15, wherein the control circuit includes a differential amplifier comprising:
a noninverting input terminal to receive an iqout average signal, the iqout average signal representing an average value of the I clock signal NAND an inverted Q clock signal;
an inverting input terminal to receive a signal representing 75% of a supply voltage;
a terminal to receive an output common mode voltage signal;
an inverting output to provide the fall time control signal; and
a noninverting output to provide the rise time control signal.

20. The dual rail quadrature clock generator of claim 19, wherein the output common mode voltage signal is generated by an amplifier having an inverting input to receive a constant voltage signal representing 50% of the supply voltage, a noninverting input to receive a signal representing an average value of the Q clock signal, and an output terminal to provide the output common mode voltage signal.

\* \* \* \* \*